United States Patent [19]
Koyama et al.

[11] Patent Number: 5,877,513
[45] Date of Patent: *Mar. 2, 1999

[54] SEMICONDUCTOR INTEGRATED CIRCUIT

[75] Inventors: Jun Koyama; Yasuhiko Takemura, both of Kanagawa, Japan

[73] Assignee: Semiconductor Energy Laboratory Co., Ltd., Kanagawa-ken, Japan

[ * ] Notice: The term of this patent shall not extend beyond the expiration date of Pat. No. 5,616,935.

[21] Appl. No.: 788,561

[22] Filed: Jan. 24, 1997

Related U.S. Application Data

[62] Division of Ser. No. 382,410, Feb. 1, 1995, Pat. No. 5,616,935.

[30] Foreign Application Priority Data

Feb. 8, 1994 [JP] Japan ........................ 6-36615

[51] Int. Cl.⁶ .................. H01L 29/76; H01L 27/108; H01L 27/104; H01L 27/01
[52] U.S. Cl. .................. 257/66; 257/69; 257/72; 257/351
[58] Field of Search ................. 257/57, 66, 67, 257/69, 350, 351

[56] References Cited

U.S. PATENT DOCUMENTS

| | | | |
|---|---|---|---|
| 4,942,241 | 7/1990 | Konishi et al. | 257/72 |
| 5,148,244 | 9/1992 | Iwasaki | 257/280 |
| 5,153,702 | 10/1992 | Aoyama | 257/293 |
| 5,243,202 | 9/1993 | Mori et al. | 257/60 |
| 5,250,931 | 10/1993 | Misawa et al. | 345/206 |
| 5,430,320 | 7/1995 | Lee | 257/66 |
| 5,514,879 | 5/1996 | Yamazaki | 257/66 |
| 5,616,935 | 4/1997 | Koyama et al. | 257/69 |

FOREIGN PATENT DOCUMENTS 0061154  2/1992  Japan ........................ 257/351

*Primary Examiner*—Wael Fahmy
*Attorney, Agent, or Firm*—Sixbey, Friedman, Leedom & Ferguson, PC; Gerald J. Ferguson, Jr.; Eric J. Robinson

[57] ABSTRACT

The absolute value of the threshold voltage of a P-channel TFT is reduced by making its channel length shorter than that of an N-channel TFT by at least 20%, to thereby approximately equalize the threshold voltage absolute values of those TFTs.

45 Claims, 3 Drawing Sheets

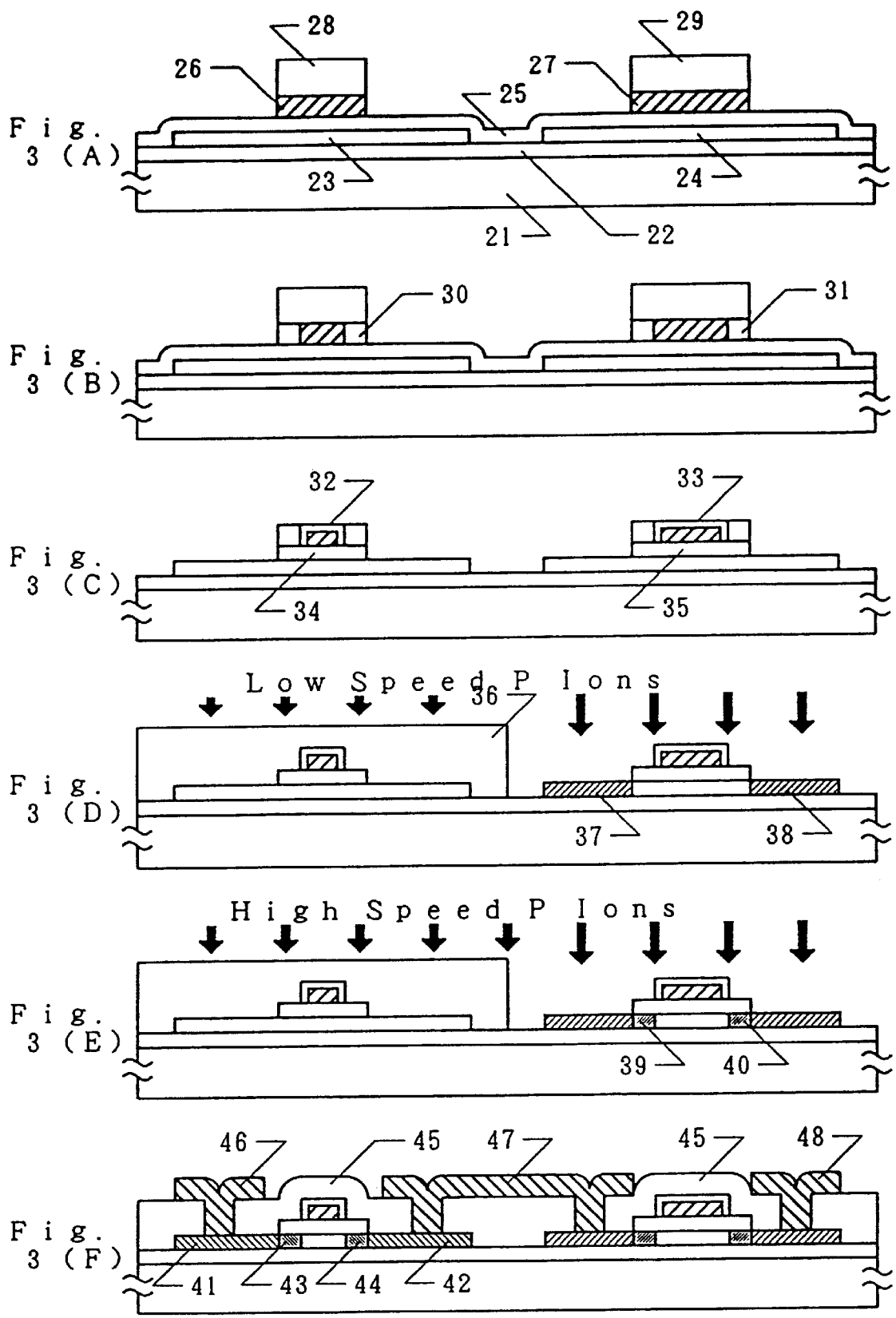

SEMICONDUCTOR INTEGRATED CIRCUIT

This is a Divisional application of Ser. No. 08/382,410, filed Feb. 1, 1995 now U.S. Pat. No. 5,616,935.

BACKGROUND OF THE INVENTION

The present invention relates to an integrated circuit having insulated-gate transistors (thin-film transistors, TFTs) that are formed on an insulating surface of an insulating material such as glass, a material in which an insulating coating of, for instance, silicon dioxide is formed on a silicon wafer, or a like material. In particular, the invention relates to a complementary integrated circuit having N-channel TFTs and P-channel TFTs.

Complementary circuits using TFTs are conventionally used to drive an active matrix type liquid crystal display device, an image sensor, and the like. However, in general, the absolute value of the threshold voltage of the TFT is larger than that of the MOS transistor using a single crystal semiconductor. Further, the absolute value of a threshold voltage of an N-channel TFT is largely different from that of a P-channel TFT. For example, the threshold voltage is 2 V in an N-channel TFT, and −4 V in a P-channel TFT.

The large difference in the absolute value of a threshold voltage between an N-channel TFT and a P-channel TFT is not preferable in the operation of complementary circuits, and is particularly a large obstacle to reduce a drive voltage. For example, when a complementary inverter is constructed using such TFTs, P-channel TFTs generally having a larger absolute value in a threshold voltage cannot operate properly with a low drive voltage. That is, in substance, the P-channel TFTs function merely as passive elements like resistors, and cannot operate sufficiently fast. To have P-channel TFTs operate as active elements, the drive voltage needs to be sufficiently high.

In particular, when the gate electrode is formed of a material whose work function $\phi M$ is smaller than 5 eV, for instance, aluminum ($\phi M=4.1$ eV), a difference $\phi MS$ in work function between the gate electrode and the intrinsic silicon semiconductor is as small as −0.6 eV. As a result, the threshold voltage of a P-channel TFT likely shifts to the negative side and that of an N-channel TFT becomes close to 0 V. Therefore, an N-channel TFT is likely rendered in a normally-on state (a current flows between the source and drain even if the gate voltage is 0 V).

In the above circumstances, it has been desired to approximately equalize the absolute value of a threshold voltage of the N-channel TFT to that of the P-channel TFT. In the case of conventional mono-crystalline semiconductor integrated circuit technology, the threshold voltages have been controlled by using N or P type impurity doping at a very small concentration, typically, less than $1\times10^{18}$ atoms/cm$^3$. That is, the threshold voltages can be controlled with an accuracy of 0.1 V or less by an impurity doping at $1\times10^{15}$ to $1\times10^{18}$ atoms/cm$^3$.

However, in the case of using non-single crystalline semiconductors, especially, polycrystalline semiconductors, even if an impurity is added at $1\times10^{18}$ atoms/cm$^3$ or less, the shift of the threshold voltage is hardly observed. Moreover, if the concentration of the impurity exceeds $1\times10^{18}$, the threshold voltage rapidly varies and the conductivity becomes p-type or n-type. This is because, polycrystalline silicon generally has a lot of defects in it. Since the defect density is about $1\times10^{18}$ atoms/cm$^3$, the added impurities are trapped by these defects and cannot be activated. Further, if the concentration of the impurity becomes larger than the defect density, the excess impurity is activated and changes the conductivity type to p-type or n-type.

SUMMARY OF THE INVENTION

In view of the above circumstances, an object of the present invention is to provide a method for approximately equalizing the absolute value of a threshold voltage of the N-channel TFT to that of the P-channel TFT.

The channel length is the distance between the source and drain regions in the TFT. Also, when source and drain regions are determined in a self-alignment manner with respect to a gate electrode, the channel length is also determined by the width of the gate electrode.

Although there occurs some diffusion of the impurity during the doping process, since the length of the diffusion is almost uniform on the entire surface of a substrate, if the structure of TFTs formed on a substrate is the same, the channel length can be determined by the width of a gate electrode. For example, the channel length is obtained by subtracting the length of the diffusion from the width of the gate electrode.

According to the invention, the channel length of a P-channel TFT is made shorter than that of an N-channel TFT preferably by at least 20%, to make the absolute value of the threshold voltage of the P-channel TFT relatively small. As a result, the threshold voltage absolute values of the P-channel and N-channel TFTs are approximately equalized while the threshold voltage of the N-channel TFT is kept large enough to prevent it from being rendered in a normally-on state.

As a result of the investigation about the relationship between the threshold voltage of the TFT and its channel length, the present inventors have discovered a tendency that the absolute value of the threshold voltage increases as the channel length becomes longer. Examples of this tendency is shown in FIGS. 1(A)–1(C). FIGS. 1(A) and 1(B) show relationships between the threshold voltage and the channel length in a P-channel (P-ch) TFT and an N-channel (N-ch) TFT, respectively. In these examples, silicon semiconductors used for the channels of the P-channel and N-channel TFTs are high quality semiconductors which exhibit intrinsic or substantially intrinsic conductivity, and in which an impurity concentration of phosphorus, boron, etc. is lower than $1\times10^{16}$ cm$^{-3}$ and carbon, oxygen or nitrogen has a concentration lower than $1\times10^{19}$ cm$^{-3}$.

Naturally, even with the same channel length, the threshold voltage varies depending on the quality and thickness of the active layer of the TFT, the thickness of the gate insulating film, and the TFT structure (for instance, existence of a lightly doped drain and/or an offset region). For example. P-channel TFTs may have different characteristics (a)–(c) as shown in FIG. 1(A). Similarly. N-channel TFTs may have different characteristics (a)–(c) as shown in FIG. 1(B). The characteristics (a)–(c) of FIG. 1(A) and those of FIG. 1(B) are of TFTs having the same structure and manufactured under the same conditions. That is, the curve (a) of FIG. 1(A) and the curve (a) of FIG. 1(B) respectively represent the threshold voltage characteristics of a P-channel TFT and an N-channel TFT having the same structure and formed on the same substrate under the equivalent conditions.

FIG. 1(C) shows characteristics obtained by superimposing the characteristics of FIGS. 1(A) and 1(B) on each other. Naturally, with the same channel length, the absolute value of the threshold voltage of the N-channel TFT is different from that of the P-channel TFT. In this example, with a channel length of 6 μm, the P-channel TFT has a threshold voltage of −3.2 V whereas the N-channel TFT has a threshold voltage of +1.8 V.

However, the threshold voltage absolute values can be approximately equalized by properly setting the channel lengths. For example, if the channel lengths of the N-channel TFT and the P-channel TFT are set at 6 μm and 4 μm, respectively, the threshold voltages of those TFTs are +1.8 V and −2.2 V, respectively.

Conversely, using FIG. 1(C), a channel length for obtaining a necessary threshold voltage can be calculated. For example, to obtain a threshold voltage absolute value of 2 V, the N-channel TFT and the P-channel TFT should have channel lengths of 6–7 μm and 3–4 μm, respectively.

FIGS. 2(A)–2(C) show an example of a complementary inverter according to the invention. FIG. 2(A) is a top view of the inverter circuit, in which a P-channel TFT is on the left side and an N-channel TFT is on the right side. In FIG. 2(A), reference numeral 1 denotes a gate electrode of the P-channel TFT; 2, a gate electrode of the N-channel TFT; 3, a source electrode of the P-channel TFT; 4, a drain wiring; and 5, a source electrode of the N-channel TFF. As seen from FIG. 1(A), a width a (which corresponds to the channel length) of the gate electrode 1 of the P-channel TFT is shorter than a width b of the gate electrode 2 of the N-channel TFT.

FIG. 2(B) is a sectional view of the above circuit, in which reference numerals 1–5 denote the same parts as those in FIG. 2(A). Reference numeral 6 denotes a gate insulating film; 7, a source of the P-channel TFT; 8, a drain of the P-channel TFT; 9, a drain of the N-channel TFT; 10, a source of the N-channel TFT; and 11, an interlayer insulator.

FIG. 2(C) shows another example, in which the gate electrode of each TFT does not overlap with the source and drain (i.e. offset gate structure). An offset width t is approximately equal to the thickness of a coating 12 or 13 (for instance, an anodic oxide film) formed around the gate electrode. In this type of TFT, the channel length is not necessarily equal to the width of the gate electrode. Further, the relationship between the channel length and the threshold voltage is not necessarily equal to that represented by (a) in FIGS. 1(A) and 1(B).

However, even in the circuit of FIG. 2(C), the relationship between the channel length and the threshold voltage is similar to that discussed in connection with FIGS. 1(A)–1(C). This is because the channel length is determined simply by the width of the gate electrode provided that the structure of the TFTs formed on the substrate is entirely the same and the size of the offset region is uniform. Therefore, as in the case of the FIG. 2(B) circuit, the absolute value of the threshold voltage of the N-channel and P-channel TFTs can be approximately equalized by making the channel lengths or gate electrode widths of those TFTs different from each other.

In accordance with the present invention, the gate electrode width of a P-channel TFT (in a direction along source and drain regions) should be 25 to 80% of the gate electrode width of an N-channel TFT in order to control the threshold voltages. Also, when using a crystalline non-single crystalline silicon (such as polycrystalline silicon), it is desirable that the concentration of N or P-type impurity such as phosphorous or boron in a channel region be as small as possible, for example, less than $1 \times 10^{18}$ atoms/cm$^3$, more preferably, less than $1 \times 10^{16}$ atoms/cm$^3$.

In the manner as described above, the absolute value of threshold voltages of the N-channel and P-channel TFTs can be approximately equalized. In general, a change in the channel length causes variations in other characteristics of a TFT, for instance, the mobility and off-current (source-drain leak current when the gate is reversely biased). Values of these characteristics can be optimized by adjusting the channel width.

Even if the channel length of a P-channel TFT is reduced, deteriorations due to the generation of hot carriers; in particular, a shift of the threshold voltage and a reduction of the mobility is small. Therefore, there occurs no problem in the reliability. Conversely, if the channel length of an N-channel TFT is increased, hot carrier generation in the drain can be suppressed. Thus, the invention is effective in improving the reliability.

BRIEF DESCRIPTION OF THE DRAWINGS

FIGS. 3(A)–(F) show an embodiment of a manufacturing method of a TFT circuit.

DESCRIPTION OF THE PREFERRED EMBODIMENTS

Figure 1A:
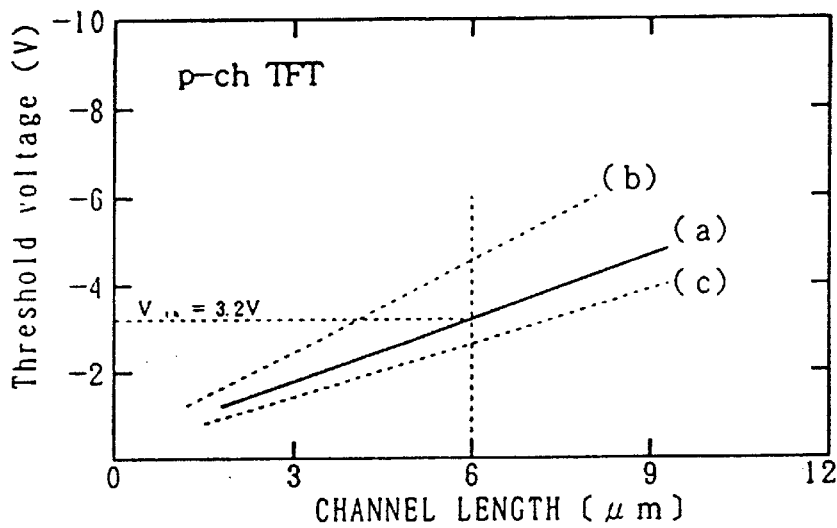
FIGS. 1(A)–1(C) show channel length dependencies of the threshold voltage of TFTs.
Figure 1B:
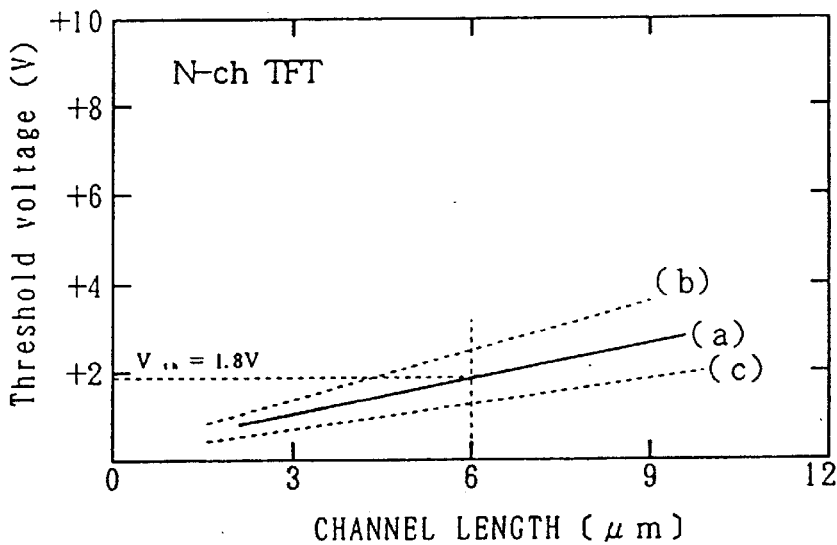
Figure 1C:
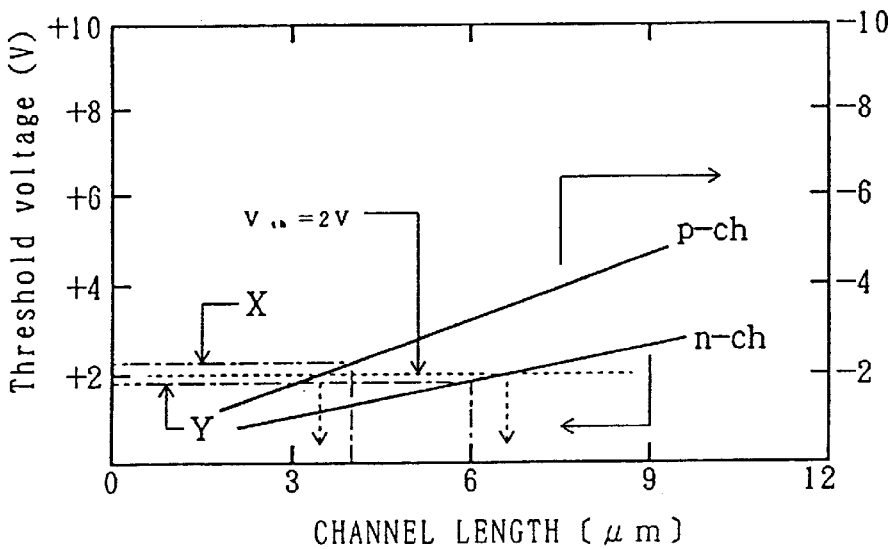

FIGS. 3(A)–(F) show a manufacturing method of a TFT circuit according to the invention. First, a silicon dioxide film of 1,000–3,000 Å in thickness as an undercoat oxide film 22 was formed on a substrate 21 (Corning 7059, 300 mm×400 mm or 100 mm×100 mm) by sputtering in an oxygen atmosphere. To improve the mass-productivity, the film may be formed by plasma CVD using TEOS as a starting material.

Subsequently, an amorphous silicon film of 300–5,000 Å. preferably 500–1,000 Å in thickness was deposited by plasma CVD or LPCVD. and crystallized by treating for 4–48 hours in a reducing atmosphere at 550°–600° C. The concentration of n-type or p-type impurities such as B or P in the amorphous silicon film was $1 \times 10^{16}$ atoms/cm$^3$ or less. Also, the concentration of carbon, oxygen or nitrogen was $5 \times 10^{18}$ atoms/cm$^3$ or less. Laser illumination may thereafter be performed to increase the degree of crystallization. Island regions 23 and 24 were then formed by patterning the crystallized silicon film. A silicon dioxide film 25 of 700–1,500 Å in thickness was formed thereon by sputtering.

Subsequently, an aluminum film (which contains Si of 1 wt % or Sc (scandium) of 0.1–0.3 wt %) of 1,000 Å to 3 μm thick was formed by electron beam evaporation or sputtering. A photoresist (for instance, OFPR 800/30 cp produced by Tokyo Ohka Co., Ltd.) was formed by spin coating. If an aluminum oxide film of 100–1,000 Å in thickness was formed thereon by anodic oxidation before forming the photoresist, good adhesiveness with the photoresist was obtained. Further, since the aluminum oxide film suppressed a leak current from the photoresist, it was effective in forming a porous anodic oxide film on only the side faces in a later anodic oxidation step. Then, the photoresist and the aluminum film were together patterned, i.e., etched to produce gate electrodes 26 and 27 and mask films 28 and 29. In this embodiment, the width of the gate electrode 27 of the N-channel TFT was made 7 μm and the width of the gate electrode 26 of the P-channel TFT was made 4 μm (see FIG. 3(A)).

Then. anodic oxide films 30 and 31 of 3,000–6,000 Å, for instance, 5,000 Å in thickness were formed by anodic oxidation in which a current was caused to flow through the above structure in an electrolyte. The anodic oxidation can be performed by using citric acid of 3–20% or an acidic aqueous solution of oxalic acid, phosphoric acid, chromic acid, sulfuric acid, or the like and applying 10–30 V to the gate electrodes with the electric current kept constant. In this embodiment, anodic oxidation was performed in an oxalic acid solution (30° C.) for 20–40 minutes by applying 10 V. The thickness of the anodic oxide film was controlled by the anodic oxidation time. As a result, the widths of the gate electrodes 26 and 27 were reduced to 3 $\mu$m and 6 $\mu$m, respectively (see FIG. 3(B)).

Then, the mask was removed, and a current was again caused to flow through the gate electrodes in an electrolytic solution, which was an ethylene glycol solution containing tartaric acid, boric acid and nitric acid of 3–10%. A better oxide film was obtained when the temperature of the solution was lower than the room temperature, i.e., about 10° C. As a result, barrier-type anodic oxide films 32 and 33 were formed on the top faces and the side faces of the gate electrodes. The thickness of the anodic oxide films 32 and 33 was proportional to the applied voltage. For example, when the voltage was 150 V, anodic oxide films of 2,000 Å in thickness were obtained. The thickness of the anodic oxide films 32 and 33 was determined in accordance with the required offset. However, the anodic oxide films 32 and 33 should be thinner than 3,000 Å, because a high voltage of more than 250 V is needed to form an anodic oxide film thicker than 3,000 Å, which voltage will adversely affect the TFT characteristics. In this embodiment, the voltage was determined within the range of 80–150 V in accordance with the necessary thickness of the anodic oxide films 32 and 33.

It should be-noted that in spite of the fact that the step of forming the barrier-type anodic oxide films 32 and 33 was performed later, they were formed between the porous anodic oxide film 30 and the gate electrode 26 and between the porous anodic oxide film 31 and the gate electrode 27, rather than the outside of the porous anodic oxide films 30 and 31.

Subsequently, the insulating film 25 was etched by dry etching (or wet etching). The etching depth can be determined arbitrarily. That is, the etching may be performed until the active layer existing thereunder is exposed, or may be stopped somewhere before it is exposed. From the viewpoints of the mass productivity, yield and uniformity, it is desirable that the etching be performed until reaching the active layer, in which case the portions of the insulating film (gate insulating film) 25 covered by the anodic oxide films 30 and 31 or the gate electrodes 26 and 27 remain as insulating films 34 and 35 of the original thickness (see FIG. 3(C)).

Then, the anodic oxide films 30 and 31 were removed. It is preferable that the etchant be of a phosphorus acid type solution, for instance, a mixed acid of phosphorus acid, acetic acid and nitric acid.

In the case of phosphorus acid type etchants, the etching rate of the porous anodic oxide film is more than 10 times that of the barrier-type anodic oxide film. Therefore, since the barrier-type anodic oxide films 32 and 33 were not etched substantially with the phosphoric acid type etchant. the gate electrodes inside thereof were protected from the etching.

Sources and drains were formed by implanting N-type or P-type accelerated impurity ions into the above structure. More specifically, after the left-hand TFT region in FIG. 3(C) was covered with a mask 36, irradiation with phosphorus ions of a relatively low speed (typical acceleration voltage: 5–30 kV) was effected by ion doping. In this embodiment, the acceleration voltage was 20 kV.

Phosphine ($PH_3$) was employed as a doping gas, and the dose was $5 \times 10^{14}$ to $5 \times 10^{15}$ cm$^{-2}$. In this step, since phosphorus ions could not penetrate the insulating film 35, they were implanted into only the portions of the active layer whose surfaces were exposed, so that a drain 37 and a source 38 of the intended N-channel TFT was formed (see FIG. 3(D)).

Then, irradiation with phosphorus ions of a relatively high speed (typical acceleration voltage: 60–120 kV) was effected also by ion doping. In this embodiment, the acceleration voltage was 90 kV, and the dose was $1 \times 10^{13}$ to $5 \times 10^{14}$ cm$^{-2}$. In this step, phosphorus ions penetrate the insulating film 35, to reach the regions thereunder. However, since the dose was low, low-concentration N-type regions 39 and 40 were formed (see FIG. 3(E)).

After completion of the doping. the mask 36 was removed. Then, in a state that the N-channel TFT was masked this time, a source 41. a drain 42 and low-concentration P-type regions 43 and 44 of the intended P-channel TFT were formed in the similar manner. Impurity ions introduced into the active layer w ere activated by irradiation with KrF excimer laser light (wavelength: 248 nm; pulse width: 20 ns).

Subsequently, a silicon dioxide film of 3,000–6,000 Å in thickness was formed, as an interlayer insulating film 45, over the entire surface by CVD. Then, contact holes for the sources and drains of the TFTs were formed, and aluminum wiring lines and electrodes 46–48 were formed. Further, hydrogen annealing was performed at 200°–400° C. Thus, a complementary inverter circuit using the TFTs was completed (see FIG. 3(F)).

In using a ring oscillator or a shift register in which inverter circuits of the above type are connected to each other in multiple stages, it is very important to equalize the threshold voltages to make its operating point located at the central voltage. Further, the invention was also effective in switching elements that require analog-type driving (for instance, transistors provided for respective pixels of an active matrix type liquid crystal display device) and in complementary transfer gates.

Figure 2:
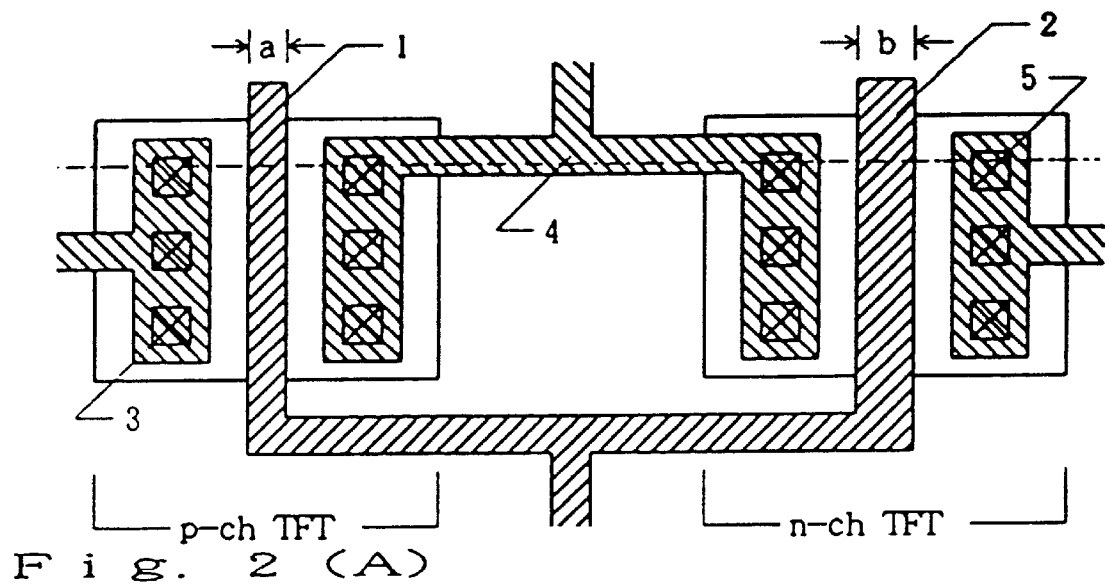
FIGS. 2(A)–2(C) show an example of a TFT circuit (complementary inverter) according to the present invention.
Figure 2:
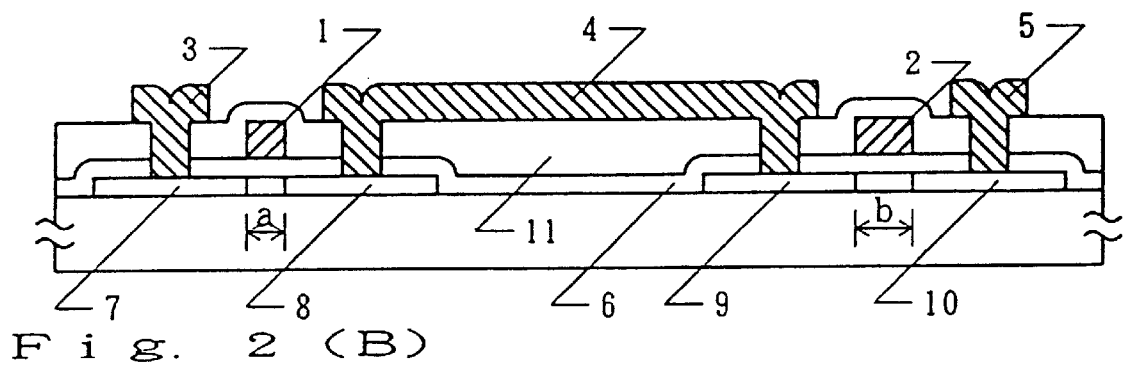
Figure 2:
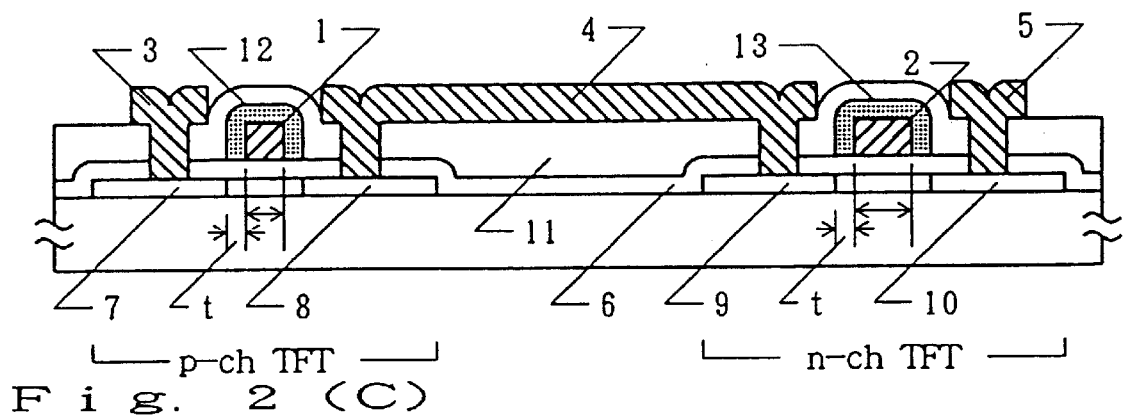

The invention has made it possible to approximately equalize the threshold voltage absolute values of the N-channel and P-channel TFTs, to thereby improve the operating efficiency of complementary circuits and reduce its drive voltage. The simplest way of practicing the invention is to change the width of the gate electrode. The optimum value of the gate electrode width should be determined in accordance with the structure and manufacturing conditions of TFTs, and is apparently not limited by the values used in the embodiments. Further, for example, there can be formed a circuit that employs P-channel TFTs of the ordinary structure (as shown in FIG. 2(B)) and N-channel TFTs in which the gate electrode is offset from the source and drain (as shown in FIG. 2(C)). though such a circuit is not illustrated.

The invention is particularly effective in a TFT in which a crystallized silicon semiconductor in contact with a silicon dioxide film is used as a channel. This is so because when an amorphous silicon film in contact with a silicon dioxide film is crystallized by thermal annealing, laser light illumination, or other means, the {111} plane orientation likely occurs due to matching, in the boundary surface.

In the {111} plane, the density $Q_{SS}$ of interface states at the interface with a silicon dioxide film is about two times that in other planes such as the {100} and {311} planes. Therefore, if a TFT is produced in the above manner, the threshold voltage tends to shift to the negative side. That is, the threshold voltage of an N-channel TFT has a value close to 0 V, to become a normally-on state, and the threshold voltage of a P-channel TFT has a large negative value. As pointed out above, this is very problematic in designing, a complementary circuit. The invention is intended to balance the threshold voltages of the N-channel and P-channel TFTs, to thereby solve the above problem. It is apparent that the invention is effective in this respect.

While the preferred embodiments have been described, it is to be understood that various modifications are possible and the present invention should be limited only by the appended claims.

What is claimed is:

1. A semiconductor integrated circuit comprising N-channel and P-channel thin film transistors formed on insulating surface, each of said N-channel and P-channel thin film transistors having a gate electrode comprising a material of which work function is smaller than 5 eV,
   wherein a channel length of the P-channel thin film transistor is made shorter than that of the N-channel film transistor by at least 20% for approximating an absolute value of a threshold voltage of the P-channel thin film transistor to that of the N-channel thin film transistor while the threshold voltage of the N-channel TFT is kept large enough to prevent it from being rendered in a normally-on state; and
   wherein a width of the gate electrode of the P-channel thin film transistor in a direction along a source region and a drain region is shorter than that of the N-channel thin film transistor by at least 25%.

2. A semiconductor integrated circuit according to claim 1 wherein the gate electrode of said N-channel thin film transistor comprises the same material as the gate electrode of said P-channel thin film transistor.

3. A semiconductor integrated circuit according to claim 1 wherein the gate electrode of said N-channel thin film transistor is electrically connected to the gate electrode of said P-channel thin film transistor.

4. A semiconductor integrated circuit according to claim 1 wherein a channel region of said N-channel and P-channel thin film transistors has an impurity of which concentration is lower than $1 \times 10^{18}$ atoms/cm$^3$ and said impurity controls conductivity type.

5. A semiconductor integrated circuit according to claim 4 wherein said impurity of said N-channel and P-channel thin film transistors are phosphorus and boron respectively.

6. A semiconductor integrated circuit according to claim 4 further comprising an element selected from a group consisting of carbon, nitrogen and oxygen in the channel region of said N-channel and P-channel thin film transistors, wherein each concentration of the carbon, nitrogen and oxygen is lower than $1 \times 10^{19}$ atoms/cm$^3$.

7. A semiconductor integrated circuit according to claim 1 wherein said N-channel and P-channel thin film transistors constitute a pair of complementary transistors.

8. A semiconductor integrated circuit according to claim 1 wherein said gate electrode comprises aluminum.

9. A semiconductor integrated circuit comprising:
   an N-channel thin film transistor formed on an insulating surface; and
   a P-channel thin film transistor formed on said insulating surface, said P-channel thin film transistor having a substantially same cross sectional structure as said N-channel thin film transistor;
   wherein a channel length of the P-channel thin film transistor is made shorter than that of the N-channel thin film transistor by at least 20% for approximating an absolute value of a threshold voltage of the P-channel thin film transistor to that of the N-channel thin film transistor, and
   wherein a width of a gate electrode of the P-channel thin film transistor in a direction along a source region and a drain region is shorter than that of the N-channel thin film transistor by at least 25%.

10. A semiconductor integrated circuit according to claim 9 wherein said N-channel and P-channel thin film transistors constitute a pair of complementary transistors.

11. A semiconductor integrated circuit according to claim 9 wherein said N-channel and P-channel thin film transistors constitute a pair of complementary transistors formed by a common process.

12. A semiconductor integrated circuit according to claim 9 wherein at least one of said N-channel and P-channel thin film transistors has an offset region.

13. A semiconductor integrated circuit according to claim 9 wherein said N-channel and P-channel thin film transistors have at lease one of an offset structure and an LDD structure.

14. A semiconductor integrated circuit comprising N-channel and P-channel thin film transistors formed on insulating surface, each of said N-channel and P-channel thin film transistors having a gate electrode comprising a material of which work function is smaller than 5 eV,
   wherein a channel length of the P-channel thin film transistor is made shorter than that of the N-channel thin film transistor by at least 20% for approximating an absolute value of a threshold voltage of the P-channel thin film transistor to that of the N-channel thin film transistor
   wherein a channel region of said N-channel and P-channel thin film transistor has a (111) plane, and
   wherein a width of the gate electrode of the P-channel thin film transistor in a direction along a source region and a drain region is shorter than that of the N-channel thin film transistor by at least 25%.

15. A semiconductor integrated circuit according to claim 14 wherein said N-channel and P-channel thin film transistors constitute a pair of complementary transistors.

16. A semiconductor integrated circuit according to claim 14 wherein said gate electrode comprises aluminum.

17. A semiconductor integrated circuit comprising:
   an N-channel thin film transistor and a P-channel thin film transistor electrically connected to said N-channel thin film transistor over a substrate, each of said thin film transistors comprising:
   a semiconductor layer having source and drain regions, and a channel region interposed between said source and drain region; and
   a gate electrode comprising a material of which work function is less than 5 eV and formed adjacent to said channel region with a gate insulating film interposed therebetween, wherein said source and drain regions are formed in a self-alignment manner with respect to said gate electrode;
   wherein the width of the gate electrode of said P-channel thin film transistor in a direction along the source and drain regions is shorter than that of said N-channel transistor by at least 25%.

18. A semiconductor integrated circuit according to claim 17 wherein the channel region of said N-channel and P-channel thin film transistors has a (111) plane.

19. A semiconductor integrated circuit according to claim 17 wherein a channel length of said P-channel transistor is shorter than that of said N-channel transistor by at least 20%.

20. A semiconductor integrated circuit according to claim 17 wherein said gate electrode comprises aluminum.

21. A semiconductor integrated circuit according to claim 17 wherein said gate electrode of the N-channel and P-channel transistor is provided with an anodic oxide film on at least side surfaces of said gate electrode, said anodic oxide film comprising an oxide of the material of said gate electrode.

22. A semiconductor integrated circuit according to claim 21 wherein said source and drain regions are offset from side edges of said gate electrode by a distance approximately equal to a thickness of said anodic oxide film.

23. A semiconductor integrated circuit comprising:
an N-channel thin film transistor and a P-channel thin film transistor electrically connected to said N-channel thin film transistor over a substrate, the P-channel thin film transistor having a substantially same cross sectional structure as the N-channel thin film transistor,
each of the thin film transistors comprising:
a semiconductor layer having a source region and a drain region, and a channel region interposed between said source region and said drain region; and
a gate electrode formed adjacent to said channel region with a gate insulating film interposed therebetween,
wherein a channel length of the P-channel thin film transistor is shorter than that of the N-channel thin film transistor by at least 20% for approximating an absolute value of a threshold voltage of the P-channel thin film transistor to that of the N-channel thin film transistor, and
wherein a width of the gate electrode of the P-channel thin film transistor in a direction along the source region and the drain region is 25 to 80% of that of the N-channel thin film transistor.

24. A semiconductor integrated circuit according to claim 23 wherein impurity concentration in the channel region of the N-channel and P-channel thin film transistors is lower than $1\times10^{18}$ atoms/cm$^3$ and the impurity controls conductivity type of the semiconductor layer.

25. A semiconductor integrated circuit according to claim 24 wherein said impurity in the channel region of the N-channer and P-channel thin film transistors are phosphorus and boron respectively.

26. A semiconductor integrated circuit according to claim 24 further comprising an element selected from a group consisting of carbon, nitrogen and oxygen in the channel region of the N-channel and P-channel thin film transistors, wherein each concentration of the carbon, nitrogen and oxygen is lower than $1\times10^{19}$ atoms/cm$^3$.

27. A semiconductor integrated circuit according to claim 23 wherein said gate electrode comprises aluminum.

28. A semiconductor integrated circuit according to claim 23 wherein said channel region of the N-channel and P-channel thin film transistors has a (111) plane.

29. A semiconductor integrated circuit according to claim 23 wherein a difference of the absolute value of the threshold voltage between the P-channel thin film transistor and the N-channel thin film transistor is 0.4 V or less.

30. A semiconductor integrated circuit comprising:
an N-channel thin film transistor and a P-channel thin film transistor electrically connected to said N-channel thin film transistor over a substrate, the P-channel thin film transistor having a substantially same cross-sectional structure as the N-channel thin film transistor,
each of the thin film transistors comprising:
a semiconductor layer having a source region and a drain region, and a channel region interposed between said source region and said drain region; and
a gate electrode formed adjacent to said channel region with a gate insulating film interposed therebetween,
wherein a channel length of the P-channel thin film transistor is shorter than that of the N-channel thin film transistor by at least 20% for approximating an absolute value of a threshold voltage of the P-channel thin film transistor to that of the N-channel thin film transistor, and
wherein a width of the gate electrode of the P-channel thin film transistor in a direction along the source region and the drain region is shorter than that of the N-channel thin film transistor by at least 25%.

31. A semiconductor integrated circuit comprising:
an N-channel thin film transistor and P-channel thin film transistor electrically connected to said N-channel thin film transistor over a substrate, the P-channel thin film transistor having a substantially same cross sectional structure as the N-channel thin film transistor,
each of the film transistors comprising:
a semiconductor layer having a source region and a drain region, and a channel region interposed between said source region and said drain region;
at least one of an offset region and a lightly doped drain region each of which is interposed between said drain region and said channel region; and
a gate electrode formed adjacent to said channel region with a gate insulating film interposed therebetween,
wherein a channel length of the P-channel thin film transistor is shorter than that of the N-channel thin film transistor by at least 20% for approximating an absolute value of a threshold voltage of the P-channel thin film transistor to that of the N-channel thin film transistor, and
wherein a width of the gate electrode of the P-channel thin film transistor in a direction along the source region and the drain region is shorter than that of the N-channel thin film transistor by at least 25%.

32. A semiconductor integrated circuit according to claim 31 wherein impurity concentration in the channel region of the N-channel and P-channel thin film transistors is lower than $1\times10^{18}$ atoms/cm$^3$ and the impurity controls conductivity type of the semiconductor layer.

33. A semiconductor integrated circuit according to claim 32 wherein said impurity in the channel region of the N-channel and P-channel thin film transistors are phosphorus and boron respectively.

34. A semiconductor integrated circuit according to claim 32 further comprising an element selected from a group consisting of carbon, nitrogen and oxygen in the channel region of the N-channel and P-channel thin film transistors, wherein each concentration of the carbon, nitrogen and oxygen is lower than $1\times10^{19}$ atoms/cm$^3$.

35. A semiconductor integrated circuit according to claim 31 wherein said gate electrode comprises aluminum.

36. A semiconductor integrated circuit according to claim 31 wherein said channel region of the N-channel and P-channel thin film transistors has a (111) plane.

37. A semiconductor integrated circuit according to claim 31 wherein said approximating means that a difference of the absolute value of the threshold voltage between the P-channel thin film transistor and the N-channel thin film transistor is 0.4 V or less.

38. A semiconductor integrated circuit comprising:
an N-channel thin film transistor and P-channel thin film transistor electrically connected to said N-channel thin film transistor over a substrate, the P-channel thin film transistor having a substantially same cross sectional structure as the N-channel thin film transistor, each of the thin film transistors comprising:
- a semiconductor layer having a source region and a drain region, and a channel region interposed between said source region and said drain region; and
- a gate electrode formed adjacent to said channel region with a gate insulating film interposed therebetween,
- wherein a channel length of the P-channel thin film transistor is shorter than that of the N-channel thin film transistor by at least 20%, and
- wherein a width of the gate electrode of the P-channel thin film transistor in a direction along the source region and the drain region is 25 to 80% of that of the N-channel thin film transistor.

39. A semiconductor integrated circuit according to claim 38 wherein impurity concentration in the channel region of the N-channel and P-channel thin film transistors is lower than $1 \times 10^{18}$ atoms/cm$^3$ and the impurity controls conductivity type of the semiconductor layer.

40. A semiconductor integrated circuit according to claim 39 wherein said impurity in the channel region of the N-channel and P-channel thin film transistors are phosphorus and boron respectively.

41. A semiconductor integrated circuit according to claim 39 further comprising an element selected from a group consisting of carbon, nitrogen and oxygen in the channel region of the N-channel and P-channel thin film transistors, wherein each concentration of the carbon, nitrogen and oxygen is lower than $1 \times 10^{19}$ atoms/cm$^3$.

42. A semiconductor integrated circuit according to claim 38 wherein said gate electrode comprises aluminum.

43. A semiconductor integrated circuit according to claim 38 wherein said channel region of the N-channel and P-channel thin film transistors has a (111) plane.

44. A semiconductor integrated circuit according to claim 38 further comprising at least one of an offset region and lightly doped drain region, wherein each of the offset region and the lightly doped drain region is interposed between said drain region and said channel region.

45. A semiconductor integrated circuit comprising:
an N-channel thin film transistor and a P-channel thin film transistor electrically connected to said N-channel thin film transistor over a substrate, the P-channel thin film transistor having a substantially same cross-sectional structure as the N-channel thin film transistor,
each of the thin film transistors comprising:
- a semiconductor layer having a source region and a drain region, and a channel region interposed between said source region and said drain region; and
- a gate electrode formed adjacent to said channel region with a gate insulating film interposed therebetween,
- wherein a channel length of the P-channel thin film transistor is shorter than that of the N-channel thin film transistor by at least 20%, and
- wherein a width of the gate electrode of the P-channel thin film transistor in a direction along the source region and the drain region is shorter than that of the N-channel thin film transistor by at least 25%.

* * * * *